(12) United States Patent
Sun

(10) Patent No.: US 8,441,121 B2
(45) Date of Patent: May 14, 2013

(54) PACKAGE CARRIER AND MANUFACTURING METHOD THEREOF

(75) Inventor: Shih-Hao Sun, Hsinchu County (TW)

(73) Assignee: Subtron Technology Co., Ltd., Hsinchu County (TW)

( * ) Notice: Subject to any disclaimer, the term of this patent is extended or adjusted under 35 U.S.C. 154(b) by 53 days.

(21) Appl. No.: 13/082,407

(22) Filed: Apr. 8, 2011

(65) Prior Publication Data

US 2012/0199955 A1 Aug. 9, 2012

(30) Foreign Application Priority Data

Feb. 8, 2011 (TW) .............................. 100104109 A

(51) Int. Cl.
*H01L 23/10* (2006.01)
*H01L 23/34* (2006.01)

(52) U.S. Cl.
USPC ....... 257/707; 257/712; 257/713; 257/E23.08

(58) Field of Classification Search ................. 257/706, 257/707, 712, 713
See application file for complete search history.

(56) References Cited

U.S. PATENT DOCUMENTS

| | | | | | |
|---|---|---|---|---|---|
| 5,438,478 | A | * | 8/1995 | Kondo et al. ................. | 361/704 |
| 6,091,137 | A | * | 7/2000 | Fukuda .......................... | 257/679 |
| 6,465,883 | B2 | * | 10/2002 | Olofsson ....................... | 257/728 |
| 6,545,353 | B2 | * | 4/2003 | Mashino ....................... | 257/724 |
| 6,861,750 | B2 | * | 3/2005 | Zhao et al. .................... | 257/739 |
| 6,921,971 | B2 | * | 7/2005 | Basho et al. .................. | 257/706 |
| 8,324,723 | B2 | * | 12/2012 | Lin et al. ....................... | 257/707 |
| 2001/0038145 | A1 | * | 11/2001 | Mashino ....................... | 257/707 |
| 2002/0038908 | A1 | * | 4/2002 | Ding et al. .................... | 257/720 |
| 2003/0092221 | A1 | * | 5/2003 | Huang et al. ................. | 438/122 |
| 2003/0146503 | A1 | * | 8/2003 | Khan et al. ................... | 257/706 |
| 2004/0051172 | A1 | * | 3/2004 | Miyazaki et al. ............. | 257/706 |
| 2004/0207073 | A1 | * | 10/2004 | Hasebe et al. ................ | 257/706 |
| 2005/0023030 | A1 | * | 2/2005 | Lee et al. ...................... | 174/252 |
| 2008/0083981 | A1 | * | 4/2008 | Romig et al. ................. | 257/707 |

FOREIGN PATENT DOCUMENTS

| | | |
|---|---|---|
| JP | S62-15881 | 1/1987 |
| JP | 05-304223 | 11/1993 |
| JP | 2006-108216 | 4/2006 |

* cited by examiner

*Primary Examiner* — David Zarneke
(74) *Attorney, Agent, or Firm* — Jianq Chyun IP Office

(57) ABSTRACT

A manufacturing method of a package carrier is provided. A first opening communicating an upper surface and a lower surface of a substrate is formed. A heat-conducting element having a top surface and a bottom surface is configured in the first opening and fixed into the first opening via an insulation material. A first insulation layer and a first metal layer are laminated onto the upper surface. A second insulation layer and a second metal layer are laminated onto the lower surface. A second opening and a third opening respectively exposing portions of the top and the bottom surfaces are formed. At least one through via passing through the first metal layer, the first insulation layer, the substrate, the second insulation layer and the second metal layer is formed. A third metal layer covering the first and second metal layers and an inner wall of the through via is formed.

6 Claims, 10 Drawing Sheets

PACKAGE CARRIER AND MANUFACTURING METHOD THEREOF

CROSS-REFERENCE TO RELATED APPLICATION

This application claims the priority benefit of Taiwan application serial no. 100104109, filed Feb. 8, 2011. The entirety of the above-mentioned patent application is hereby incorporated by reference herein and made a part of this specification.

BACKGROUND OF THE INVENTION

1. Field of the Invention

The invention relates to a semiconductor structure and a manufacturing method thereof. More particularly, the invention relates to a package carrier and a manufacturing method thereof.

2. Description of Related Art

The chip package aims at protecting an exposed chip, lower the density of chip contacts, and effectively dissipate heat generated by the chip. A leadframe often serves as a carrier of the chip when a conventional wire bonding technique is applied. As contact density in the chip gradually increases, the leadframe is no longer able to further improve the contact density and thus can be replaced by a package substrate which can achieve favorable contact density. Besides, the chip is packaged onto the package substrate by conductive media, such as metal conductive wires or bumps.

In the most common light emitting diode (LED) package structure, an LED chip need be packaged before the LED chip is used, and the LED chip generates a significant amount of heat when emitting light. Given the heat generated by the LED chip cannot be well dissipated and continues to accumulate in the LED package structure, the temperature of the LED package structure continuously increases. As such, the overly heated LED chip may have luminance decay, shortened life span, or even permanent damages.

As the integrity of integrated circuits continues to increase, the mismatch of the coefficient of thermal expansion between the LED chip and the package substrate often leads to increasing thermal stress and warpage therebetween. Ultimately, the reliability of the connection between the LED chip and the package substrate declines. In addition to enhancement of the light extraction efficiency, the current package technology focuses on decreasing the thermal stress of the package structure to increase the lifetime and the reliability of the package structure.

SUMMARY OF THE INVENTION

The invention is directed to a package carrier suitable for carrying a heat-generating element.

The invention is further directed to a manufacturing method of a package carrier. By applying the manufacturing method, the aforesaid package carrier can be formed.

In an embodiment of the invention, a manufacturing method of a package carrier includes following steps. A substrate is provided. The substrate has an upper surface and a lower surface opposite to the upper surface. A first opening communicating the upper surface and the lower surface of the substrate is formed. A heat-conducting element is configured in the first opening of the substrate. The heat-conducting element is fixed into the first opening of the substrate via an insulation material, and the heat-conducting element has a top surface and a bottom surface opposite to the top surface. A first insulation layer and a first metal layer located on the first insulation layer are laminated onto the upper surface of the substrate, and a second insulation layer and a second metal layer located on the second insulation layer are laminated onto the lower surface of the substrate. The first insulation layer is located between the substrate and the first metal layer and covers the top surface of the heat-conducting element and a portion of the insulation material. The second insulation layer is located between the substrate and the second metal layer and covers the bottom surface of the heat-conducting element and a portion of the insulation material. A second opening and a third opening are formed. The second opening passes through the first metal layer and the first insulation layer and exposes a portion of the top surface. The third opening passes through the second metal layer and the second insulation layer and exposes a portion of the bottom surface. At least one through via passing through the first metal layer, the first insulation layer, the substrate, the second insulation layer, and the second metal layer is formed. A third metal layer is formed. The third metal layer covers the first metal layer, a portion of the first insulation layer and the portion of the top surface exposed by the second opening, the second metal layer, a portion of the second insulation layer and the portion of the bottom surface exposed by the third opening, and an inner wall of the through via. A solder mask is formed on the third metal layer. A surface passivation layer is formed. The surface passivation layer covers both the third metal layer that is exposed by the solder mask and the third metal layer that is located on the inner wall of the through via.

In an embodiment of the invention, a package carrier suitable for carrying a heat-generating element is provided. The package carrier includes a substrate, a heat-conducting element, an insulation material, a first insulation layer, a second insulation layer, a first metal layer, a second metal layer, at least one through via, a third metal layer, a solder mask, and a surface passivation layer. The substrate has an upper surface, a lower surface opposite to the upper surface, and a first opening communicating the upper surface and the lower surface. The heat-conducting element is configured in the first opening of the substrate and has a top surface and a bottom surface opposite to the top surface. The insulation material fills the first opening of the substrate to fix the heat-conducting element into the first opening of the substrate. The first insulation layer is configured on the upper surface of the substrate and covers the upper surface and a portion of the insulation material. Here, the first insulation layer has a second opening, and the second opening exposes a portion of the top surface of the heat-conducting element. The second insulation layer is configured on the lower surface of the substrate and covers the lower surface and a portion of the insulation material. Here, the second insulation layer has a third opening, and the third opening exposes a portion of the bottom surface of the heat-conducting element. The first metal layer is configured on the first insulation layer. The second metal layer is configured on the second insulation layer. The through via passes through the first metal layer, the first insulation layer, the substrate, the second insulation layer, and the second metal layer. The third metal layer covers the first metal layer, the first insulation layer and the portion of the top surface of the heat-conducting element exposed by the second opening, the second metal layer, the second insulation layer and the portion of the bottom surface of the heat-conducting element exposed by the third opening, and an inner wall of the through via. The solder mask is configured on the third metal layer. The surface passivation layer covers both the third metal layer that is exposed by the solder mask and the third metal layer that is located on the inner wall of the through via.

The heat-generating element is configured on the surface passivation layer that is correspondingly located above the portion of the top surface of the heat-conducting element exposed by the second opening.

Based on the above, the package carrier described in the above embodiments has the heat-conducting element that is embedded in the substrate. Hence, when a heat-generating element is configured on the package carrier, the heat generated by the heat-generating element can be rapidly transmitted to the external surroundings through the heat-conducting element and the metal layers located on the substrate. As such, the package carrier described in the embodiments of the invention can effectively dissipate the heat generated by the heat-generating element, and the efficiency and the life span of the heat-generating element can both be improved. In addition, the package carrier described in the above embodiments of the invention has the conductive layers and the insulation layers that are laminated onto the substrate, which not only can enhance the structural strength of the entire package carrier but also can improve heat-conducting effects of the package carrier. To sum up, the package carrier described in the embodiments of the invention is characterized by favorable heat-conducting capacity and strong structural strength.

In order to make the aforementioned and other features and advantages of the invention more comprehensible, embodiments accompanying figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

Figure 1A:
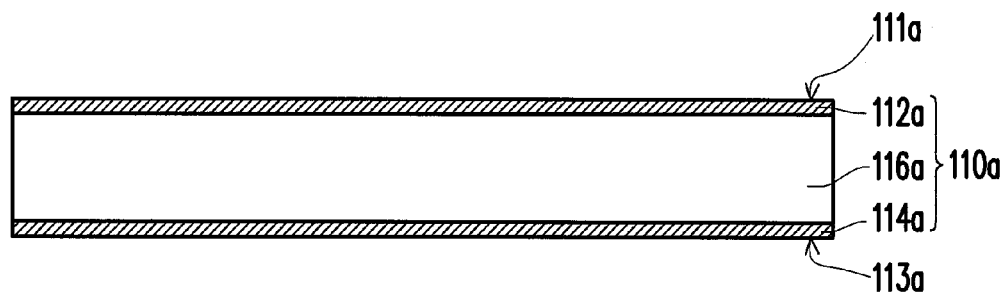
FIG. 1A to FIG. 1H are schematic cross-sectional views illustrating a manufacturing method of a package carrier according to an embodiment of the invention.

FIG. 1A to FIG. 1H are schematic cross-sectional views illustrating a manufacturing method of a package carrier according to an embodiment of the invention. With reference to FIG. 1A, according to the manufacturing method of the package carrier in this embodiment, a substrate 110a is provided. The substrate 110a has an upper surface 111a and a lower surface 113a opposite to the upper surface 111a. In this embodiment, the substrate 110a, for instance, includes a first copper foil layer 112a, a second copper foil layer 114a, and a core dielectric layer 116a configured between the first copper foil layer 112a and the second copper foil layer 114a. Namely, the substrate 110a of this embodiment is a double-sided substrate.

Figure 1B:
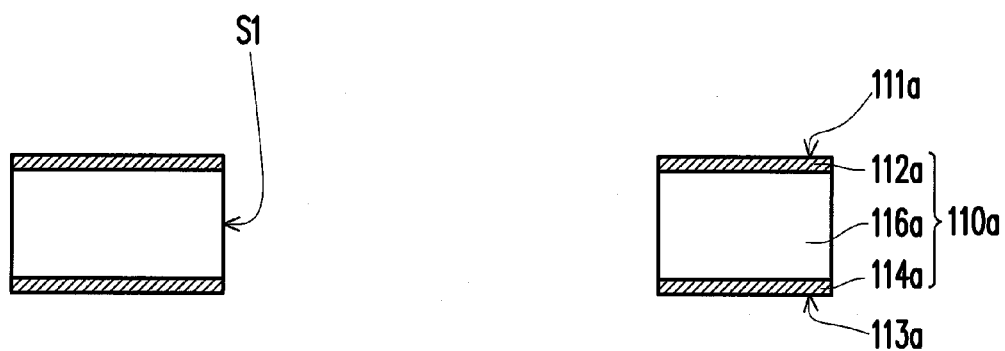

With reference to FIG. 1B, a first opening S1 communicating the upper surface 111a and the lower surface 113a of the substrate 110a is formed by stamping or routing, for instance.

Figure 1C:
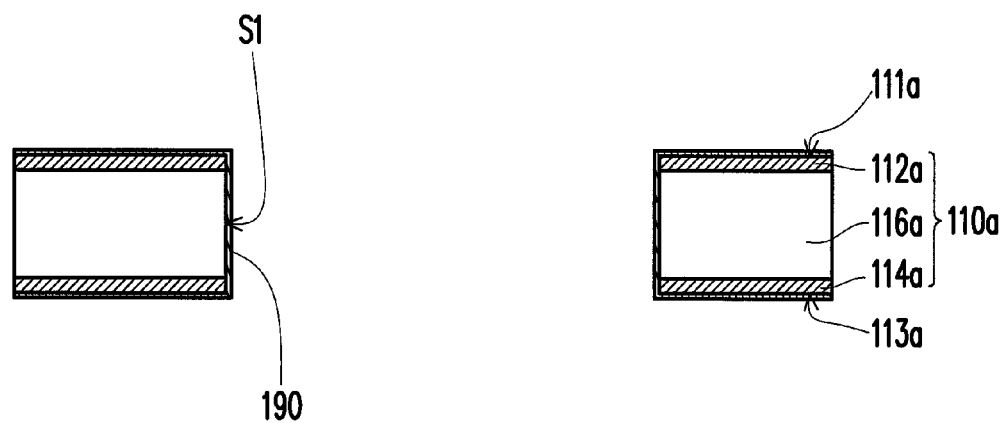

As indicated in FIG. 1C, a seed layer 190 is formed on the upper surface 111a of the substrate 110a, the lower surface 113a of the substrate 110a, and an inner wall of the first opening S1. Here, the seed layer 190 covers the first copper foil layer 112a, the second copper foil layer 114a, and the inner wall of the first opening S1, and a method of forming the seed layer 190 includes electroplating. In other embodiments that are not shown in the drawings, the seed layer 190 is not required. Namely, whether the seed layer 190 is formed or not is determined based on the manufacturing requirement.

Figure 1D:
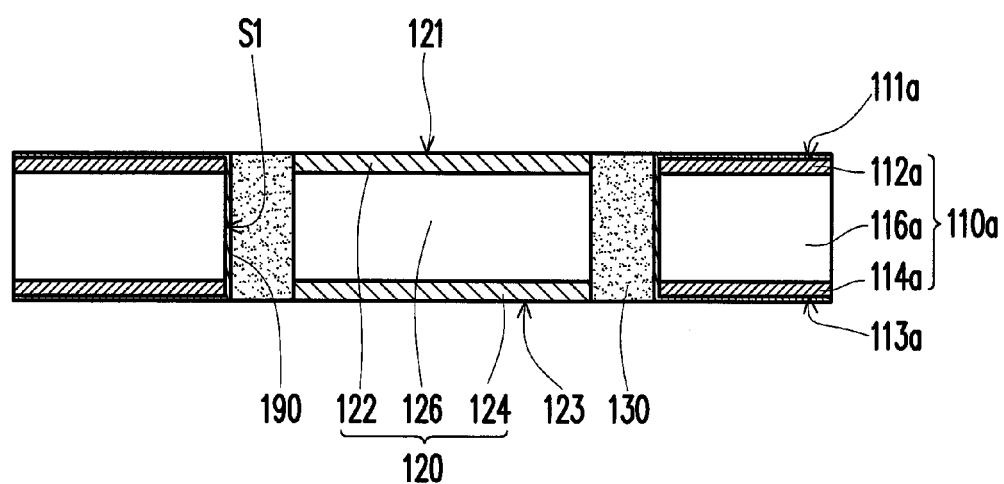

With reference to FIG. 1D, a heat-conducting element 120 is configured in the first opening S1 of the substrate 110a. Here, the heat-conducting element 120 is fixed into the first opening S1 of the substrate 110a via an insulation material 130, for instance. That is to say, the insulation material 130 is configured in the first opening S1 of the substrate 110a to fix the relative location of the heat-conducting element 120 and the substrate 110a. In this embodiment, the seed layer 190 is formed on the upper surface 111a of the substrate 110a, the lower surface 113a of the substrate 110a, and the inner wall of the first opening S1. Therefore, when the insulation material 130 is configured in the first opening S1, the seed layer 190 can strengthen the bonding force between the seed layer 190 and the insulation material 130 as well as enhance the reliability of the insulation material 130. Besides, the heat-conducting element 120 of this embodiment has a top surface 121 and a bottom surface 123 opposite to the top surface 121.

In particular, according to this embodiment, the heat-conducting element 120 includes a first conductive layer 122, a second conductive layer 124, and an insulation material layer 126 located between the first conductive layer 122 and the second conductive layer 124. A coefficient of thermal expansion of the heat-conducting element 120 is smaller than a coefficient of thermal expansion of the substrate 110a, and a coefficient of thermal conductivity of the heat-conducting element 120 is greater than a coefficient of thermal conductivity of the substrate 110a. Specifically, the coefficient of thermal expansion of the heat-conducting element 120 ranges from 3 ppm/° C. to 30 ppm/° C., for instance, and the coefficient of thermal conductivity of the heat-conducting element 120 ranges from 20 W/m*K to 500 W/m*K. The coefficient of thermal conductivity of the insulation material layer 126 of the heat-conducting element 120 is greater than the coefficient of thermal conductivity of the core dielectric layer 116a of the substrate 110a. In addition, a material of the heat-conducting element 120 is, for instance, ceramics with or without the through silicon via (TSV), silicon with or without the TSV, silicon carbide, diamond, or metal.

Figure 1E:
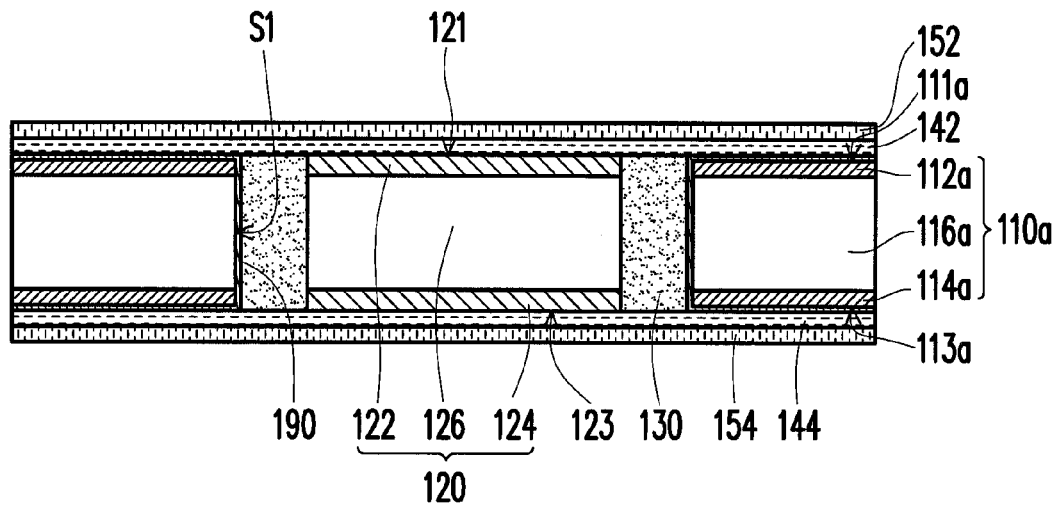

With reference to FIG. 1E, a first insulation layer 142 and a first metal layer 152 located on the first insulation layer 142 are laminated onto the upper surface 111a of the substrate 110a, and a second insulation layer 144 and a second metal layer 154 located on the second insulation layer 144 are laminated onto the lower surface 113a of the substrate 110a. In detail, according to this embodiment, the first insulation layer 142 is located between the substrate 110a and the first metal layer 142. Besides, the first insulation layer 142 covers the top surface 121 of the heat-conducting element 120, a portion of the insulation material 130, and a portion of the seed layer 190 located on the first copper foil layer 112a. The second insulation layer 144 is located between the substrate 110a and the second metal layer 154. In addition, the second insulation layer 144 covers the bottom surface 123 of the heat-conducting element 120, a portion of the insulation material 130, and a portion of the seed layer 190 located on the second copper foil layer 114a. Moreover, in this embodiment, a method of laminating the first insulation layer 142 and the first metal layer 152 onto the upper surface 111a of the substrate 110a and laminating the second insulation layer 144 and the second metal layer 154 onto the lower surface 113a of the substrate 110a is thermal compression, for instance.

Figure 1F:
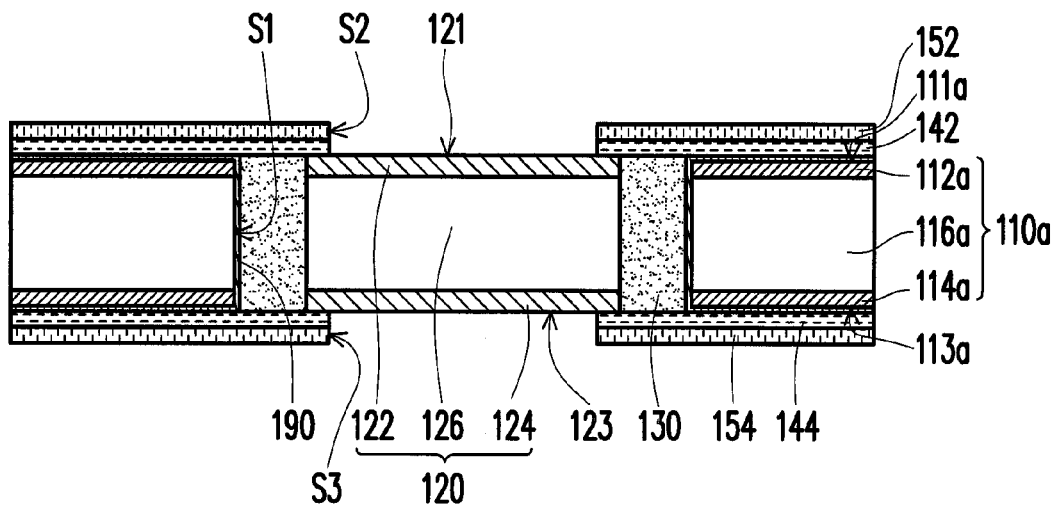

With reference to FIG. 1F, a second opening S2 and a third opening S3 are formed. The second opening S2 passes through the first metal layer 152 and the first insulation layer 142 and exposes a portion of the top surface 121 of the heat-conducting element 120. The third opening S3 passes through the second metal layer 154 and the second insulation layer 144 and exposes a portion of the bottom surface 123 of the heat-conducting element 120. According to this embodiment, a method of forming the second opening S2 and the third opening S3 includes mechanical drilling or laser drilling.

Figure 1G:
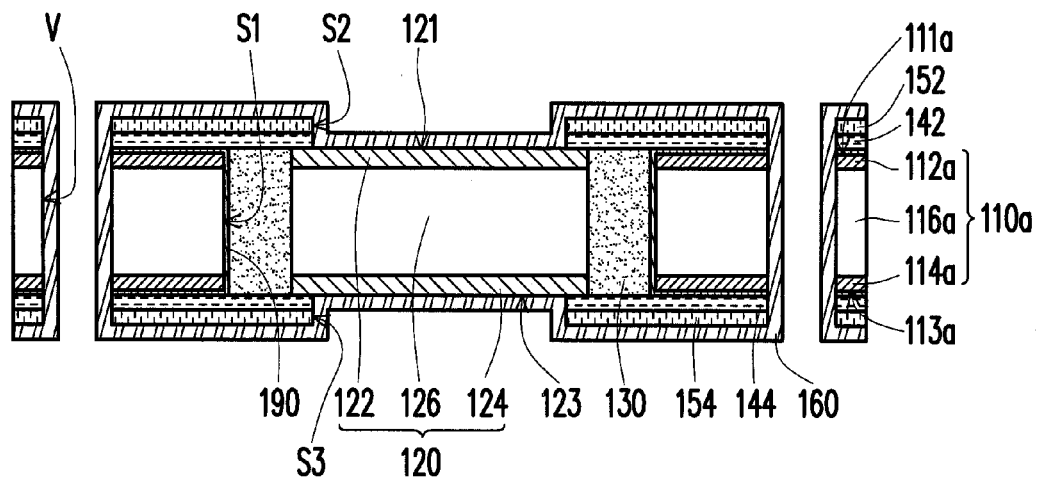

With reference to FIG. 1G, at least one through via V that passes through the first metal layer 152, the first insulation layer 142, the substrate 110a, the second insulation layer 144, and the second metal layer 154 is formed. In FIG. 1G, two through vias V are schematically shown. A method of forming the through vias V includes mechanical drilling or laser drilling.

As shown in FIG. 1G, a third metal layer 160 is formed to cover the first metal layer 152, a portion of the first insulation layer 142 and the portion of the top surface 121 of the heat-conducting element 120 exposed by the second opening S2, the second metal layer 154, a portion of the second insulation layer 144 and the portion of the bottom surface 123 of the heat-conducting element 120 exposed by the third opening S3, and the inner wall of the through vias V. In this embodiment, the third metal layer 160 is formed by electroplating, for instance.

Figure 1H:
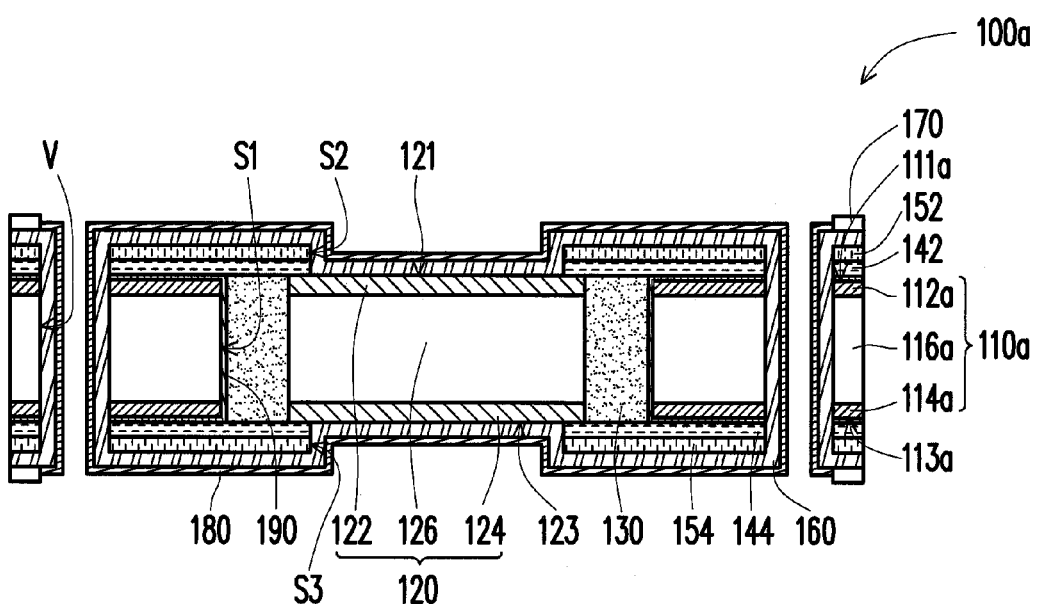

With reference to FIG. 1H, a solder mask 170 is formed on the third metal layer 160. A surface passivation layer 180 is formed. The surface passivation layer 180 covers both the third metal layer 160 exposed by the solder mask 170 and the third metal layer 160 located on the inner wall of the through vias V. In this embodiment, the surface passivation layer 180 is made of nickel gold, for instance, so as to reduce the oxidization rate of the first and second metal layers 152 and 154. So far, fabrication of the package carrier 100a is substantially completed.

In terms of the structure of the package carrier 100a, as shown in FIG. 1H, the package carrier 100a of this embodiment includes the substrate 110a, the heat-conducting element 120, the insulation material 130, the first insulation layer 142, the second insulation layer 144, the first metal layer 152, the second metal layer 154, at least one through via V, the third metal layer 160, the solder mask 170, and the surface passivation layer 180. In FIG. 1H, two through vias V are schematically illustrated. The substrate 110a includes the first copper foil layer 112a, the second copper foil layer 114a, and the core dielectric layer 116a. Besides, the substrate 110a has the upper surface 111a, the lower surface 113a opposite to the upper surface 111a, and the first opening S1 communicating the upper surface 111a and the lower surface 113a. The heat-conducting element 120 is configured in the first opening 51 of the substrate 110a and has the top surface 121 and the bottom surface 123 opposite to the top surface 121. The insulation material 130 fills the first opening S1 of the substrate 110a to fix the heat-conducting element 120 into the first opening S1 of the substrate 110a. The first insulation layer 142 is configured on the upper surface 111a of the substrate 110a and covers the upper surface 111a and a portion of the insulation material 130. Here, the first insulation layer 142 has a second opening S2, and the second opening S2 exposes a portion of the top surface 121 of the heat-conducting element 120. The second insulation layer 144 is configured on the lower surface 113a of the substrate 110a and covers the lower surface 113a and a portion of the insulation material 130. Here, the second insulation layer 144 has a third opening S3, and the third opening S3 exposes a portion of the bottom surface 123 of the heat-conducting element 120. The first metal layer 152 is configured on the first insulation layer 142. The second metal layer 154 is configured on the second insulation layer 144. The through vias V pass through the first metal layer 152, the first insulation layer 142, the substrate 110a, the second insulation layer 144, and the second metal layer 154. The third metal layer 160 covers the first metal layer 152, the first insulation layer 142 and the portion of the top surface 121 of the heat-conducting element 120 exposed by the second opening S2, the second metal layer 154, the second insulation layer 144 and the portion of the bottom surface 123 of the heat-conducting element 120 exposed by the third opening S3, and the inner wall of the through vias V. The solder mask 170 is configured on the third metal layer 160. The surface passivation layer 180 covers both the third metal layer 160 that is exposed by the solder mask 170 and the third metal layer 160 that is located on the inner wall of the through vias V.

Figure 2:
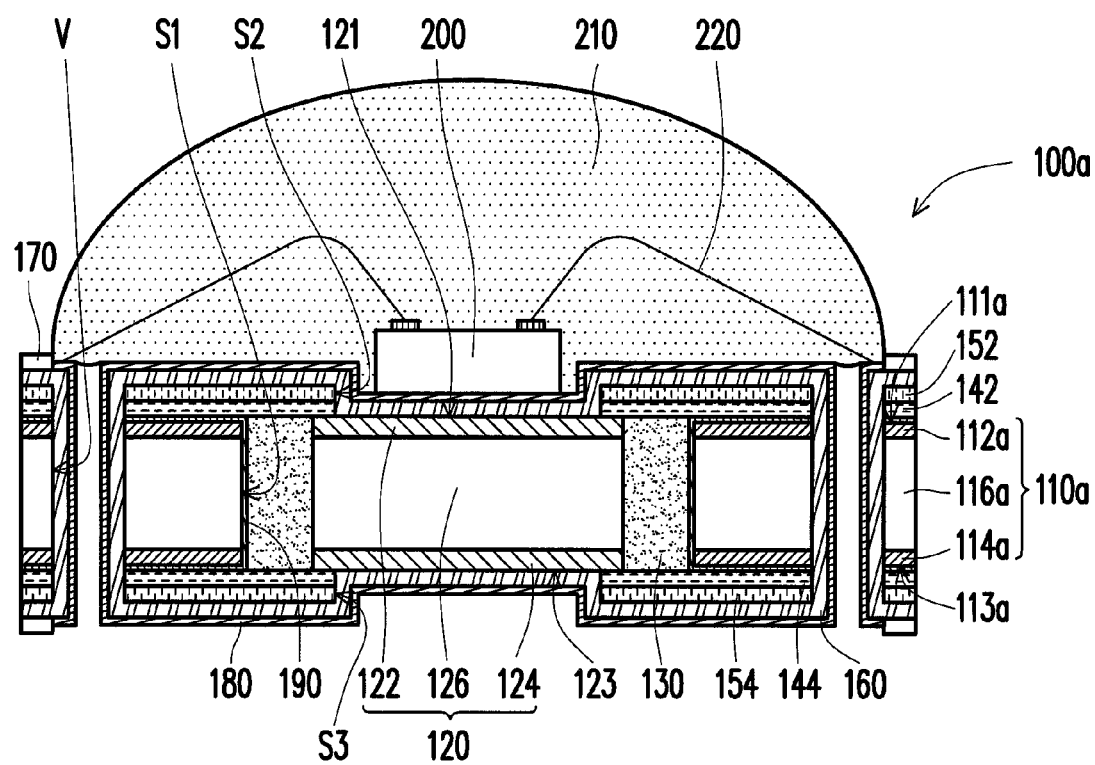
FIG. 2 is a schematic cross-sectional view illustrating that the package carrier depicted in FIG. 1H holds a heat-generating element.

FIG. 2 is a schematic cross-sectional view illustrating that the package carrier depicted in FIG. 1H holds a heat-generating element. With reference to FIG. 2, in this embodiment, the package carrier 100a is suitable for holding a heat-generating element 200. The heat-generating element 200 is configured on the surface passivation layer 180 correspondingly located above a portion of the top surface 121 of the heat-conducting element 120 exposed by the second opening S2. The heat-generating element 200 is an electronic chip or a photoelectric device, for instance, which should not be construed as a limitation to the invention. For instance, the electronic chip can be an integrated circuit chip, e.g., a chip module or an individual chip that includes a graphic chip, a memory chip, and a semiconductor chip. The photoelectric element is a light emitting diode (LED), a laser diode, or a gas discharge light source, for instance. In this embodiment, the heat-generating element 200 is an LED, for instance.

Specifically, the heat-generating element 200, e.g., a semiconductor chip, can be electrically connected to the surface passivation layer 180 by wire bonding through a plurality of bonding wires 220. Alternatively, the heat-generating element 200, the bonding wires 220, and a portion of the package carrier 100a can be encapsulated by a molding compound 210, so as to secure the electrical connection among the heat-generating element 200, the bonding wires 220, and the package carrier 100a. Since the coefficient of thermal expansion of the heat-conducting element 120 of this embodiment is smaller than the coefficient of thermal expansion of the substrate 110a, the difference in the coefficient of thermal expansion of the heat-generating element 200, the coefficient of thermal expansion of the heat-conducting element 120, and the coefficient of thermal expansion of the substrate 110a can gradually decrease. As such, the difference in the coefficient of thermal expansion is not significant enough to increase the stress among the heat-generating element 200, the heat-conducting element 120, and the substrate 110a. Thereby, the heat-generating element 200 is not peeled off or damaged, and the reliability of the package carrier 100a can be improved.

In addition, the coefficient of thermal conductivity of the heat-conducting element 120 is greater than the coefficient of thermal conductivity of the substrate 110a, and the heat-conducting element 120 is embedded in the substrate 110a. The first metal layer 152 and the second metal layer 154 are respectively configured above the top surface 121 and the bottom surface 123 of the heat-conducting element 120. Therefore, when the het-generating element 200 is configured on the package carrier 100a, the heat generated by the heat-generating element 200 can be rapidly transmitted to the external surroundings through the heat-conducting element 120 and the metal layers (including the first, second, and third metal layers 152, 154, and 160) located on the substrate 110a. As such, the package carrier 100a described in the embodiments of the invention can effectively dissipate the heat generated by the heat-generating element 200, and the efficiency and the life span of the heat-generating element 200 can both be improved. Moreover, the insulation layers (i.e., the first and second insulation layers 142 and 144) and the metal layers (i.e., the first and second metal layers 152 and 154) that can enhance the structural strength are configured on the substrate 110a. Hence, the package carrier 100a of this embodiment can have favorable structural strength when the package carrier 100a holds the heat-generating element 200.

Note that the way to bond the heat-generating element 200 and the package carrier 100a and the type of the heat-generating element 200 are not limited in the invention. Although the heat-generating element 200 described in this embodiment is electrically connected to the surface passivation layer 180 of the package carrier 100a by wire bonding through a plurality of bonding wires, the heat-generating element 200 in another embodiment can also be electrically connected to the surface passivation layer 180 located above the heat-conducting element 120 by flip-chip bonding through a plurality of bumps (not shown). In another embodiment of the invention, the heat-generating element 200 can be a chip package (not shown) and is installed to the package carrier 100a by conducting a surface mount technology (SMT). The way to bond the heat-generating element 200 and the package carrier 100a and the type of the heat-generating element 200 are exemplary and should not be construed as limitations to the invention.

Figure 3A:
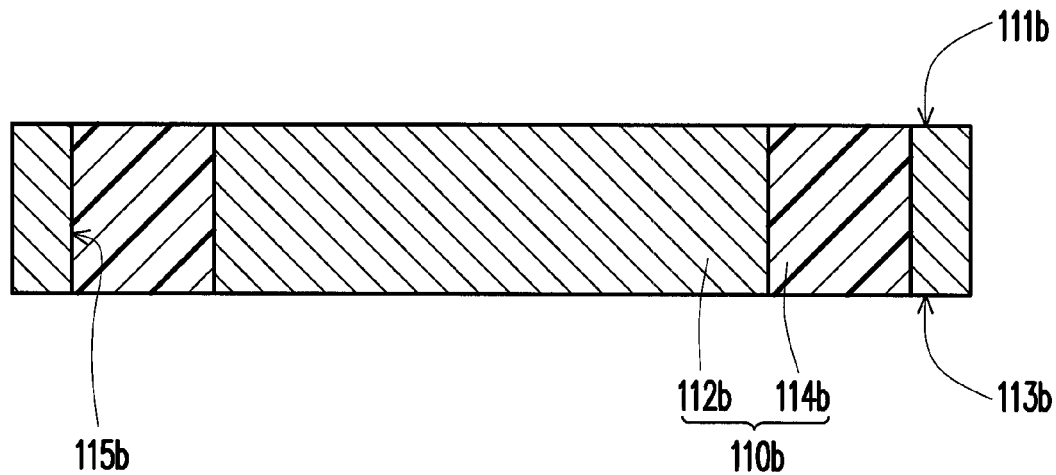
FIG. 3A to FIG. 3G are schematic cross-sectional views illustrating a manufacturing method of a package carrier according to another embodiment of the invention.

FIG. 3A to FIG. 3G are schematic cross-sectional views illustrating a manufacturing method of a package carrier according to another embodiment of the invention. With reference to FIG. 3A, according to the manufacturing method of the package carrier in this embodiment, a substrate 110b is provided. The substrate 110b has an upper surface 111b and a lower surface 113b opposite to the upper surface 111b. In this embodiment, the substrate 110b includes a metal board 112b and at least one insulation block 114b. In FIG. 3A, two insulation blocks 114b are schematically illustrated. The metal board 112b has at least one through hole 115b communicating the upper surface 111b and the lower surface 113b. In FIG. 3A, two through holes 115b are schematically depicted, and the insulation blocks 114b are configured in the through holes 115b, respectively.

Figure 3B:
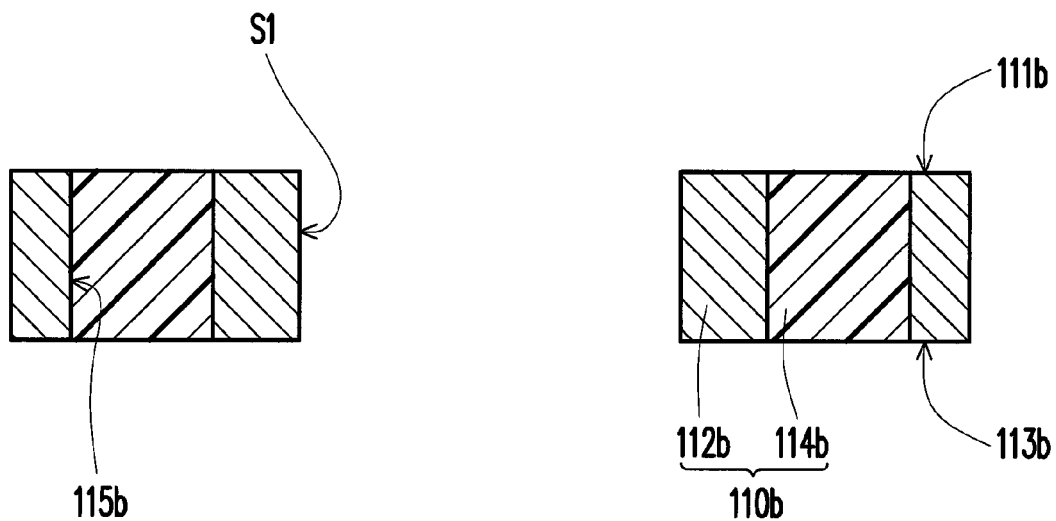

With reference to FIG. 3B, a first opening S1 passing through the metal board 112b is formed by stamping or routing, for instance.

Figure 3C:
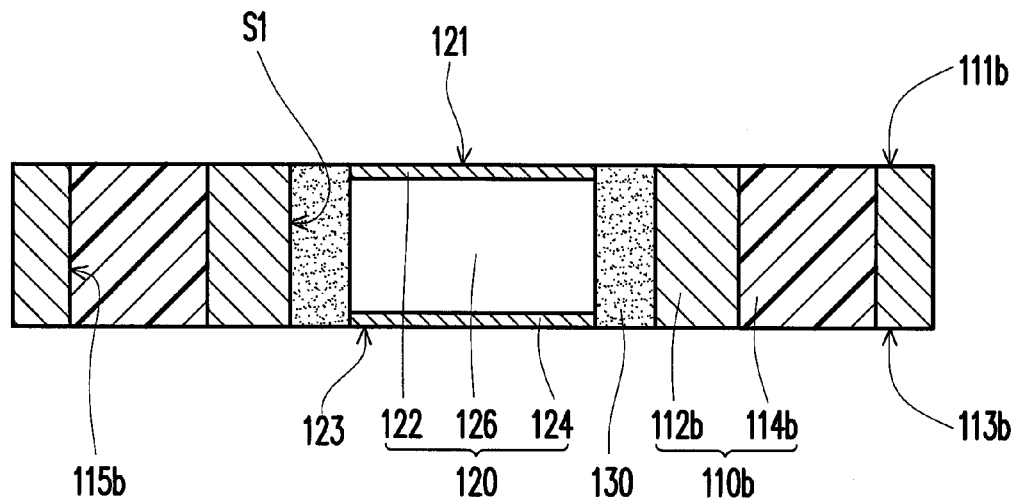

With reference to FIG. 3C, a heat-conducting element 120 is configured in the first opening S1. Here, the heat-conducting element 120 is fixed into the first opening S1 via an insulation material 130, for instance. That is to say, the insulation material 130 is configured in the first opening S1 to fix the relative location of the heat-conducting element 120 and the substrate 110b. Besides, the heat-conducting element 120 of this embodiment has a top surface 121 and a bottom surface 123 opposite to the top surface 121.

In particular, according to this embodiment, the heat-conducting element 120 includes a first conductive layer 122, a second conductive layer 124, and an insulation material layer 126 located between the first conductive layer 122 and the second conductive layer 124. The coefficient of thermal expansion of the heat-conducting element 120 is smaller than the coefficient of thermal expansion of the substrate 110b, and the coefficient of thermal conductivity of the heat-conducting element 120 is greater than the coefficient of thermal conductivity of the substrate 110b. Specifically, the coefficient of thermal expansion of the heat-conducting element 120 ranges from 3 ppm/° C. to 30 ppm/° C., for instance, and the coefficient of thermal conductivity of the heat-conducting element 120 ranges from 20 W/m*K to 500 W/m*K. In addition, a material of the heat-conducting element 120 is, for instance, ceramics with or without the TSV, silicon with or without the TSV, silicon carbide, diamond, or metal.

Figure 3D:
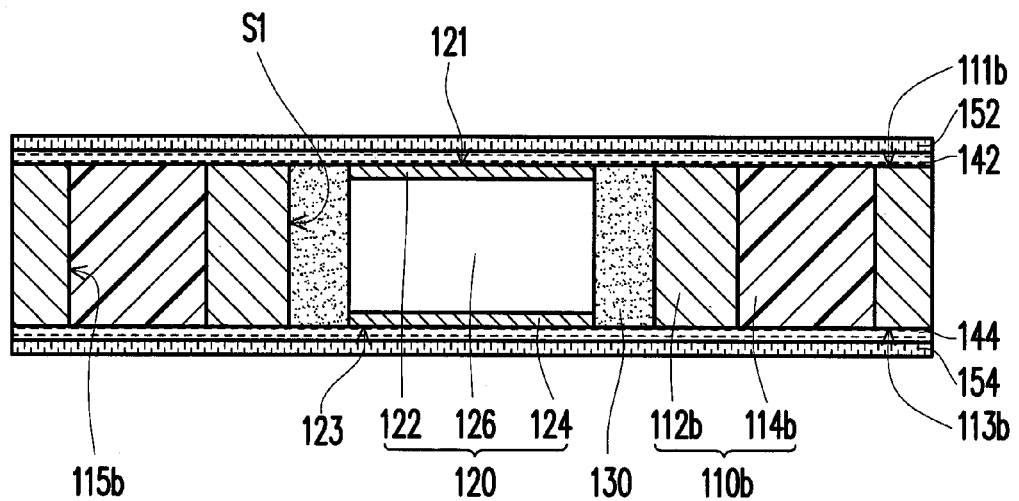

With reference to FIG. 3D, a first insulation layer 142 and a first metal layer 152 located on the first insulation layer 142 are laminated onto the upper surface 111b of the substrate 110b, and a second insulation layer 144 and a second metal layer 154 located on the second insulation layer 144 are laminated onto the lower surface 113b of the substrate 110b. In detail, according to this embodiment, the first insulation layer 142 is located between the substrate 110b and the first metal layer 142. Besides, the first insulation layer 142 covers the top surface 121 of the heat-conducting element 120, a portion of the insulation material 130, and the upper surface 111b of the substrate 110b. The second insulation layer 144 is located between the substrate 110b and the second metal layer 154. In addition, the second insulation layer 144 covers the bottom surface 123 of the heat-conducting element 120, a portion of the insulation material 130, and the lower surface 113b of the substrate 110b. Moreover, in this embodiment, a method of laminating the first insulation layer 142 and the first metal layer 152 onto the upper surface 111b of the substrate 110b and laminating the second insulation layer 144 and the second metal layer 154 onto the lower surface 113b of the substrate 110b is thermal compression, for instance.

Figure 3E:
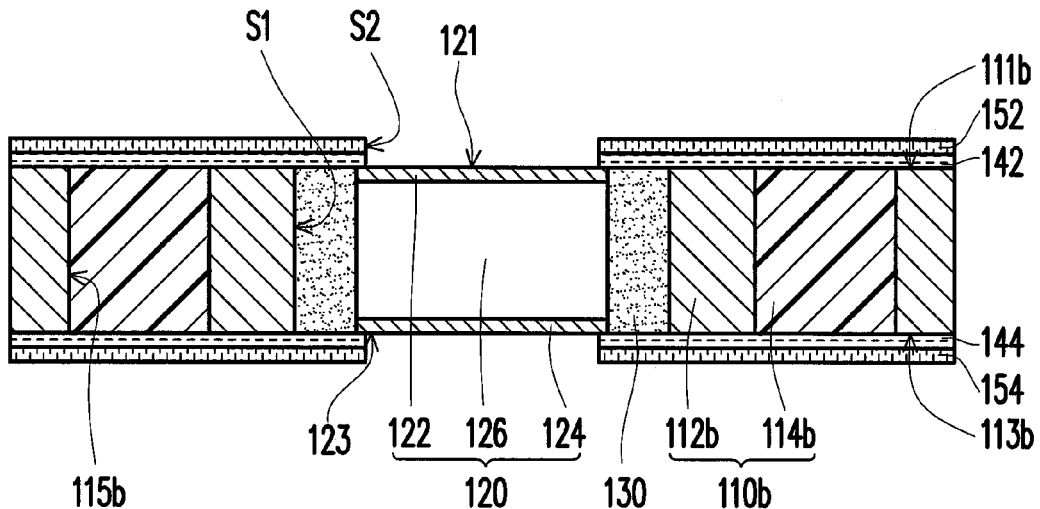

With reference to FIG. 3E, a second opening S2 and a third opening S3 are formed. The second opening S2 passes through the first metal layer 152 and the first insulation layer 142 and exposes a portion of the top surface 121 of the heat-conducting element 120. The third opening S3 passes through the second metal layer 154 and the second insulation layer 144 and exposes a portion of the bottom surface 123 of the heat-conducting element 120. According to this embodiment, a method of forming the second opening S2 and the third opening S3 includes mechanical drilling or laser drilling.

Figure 3F:
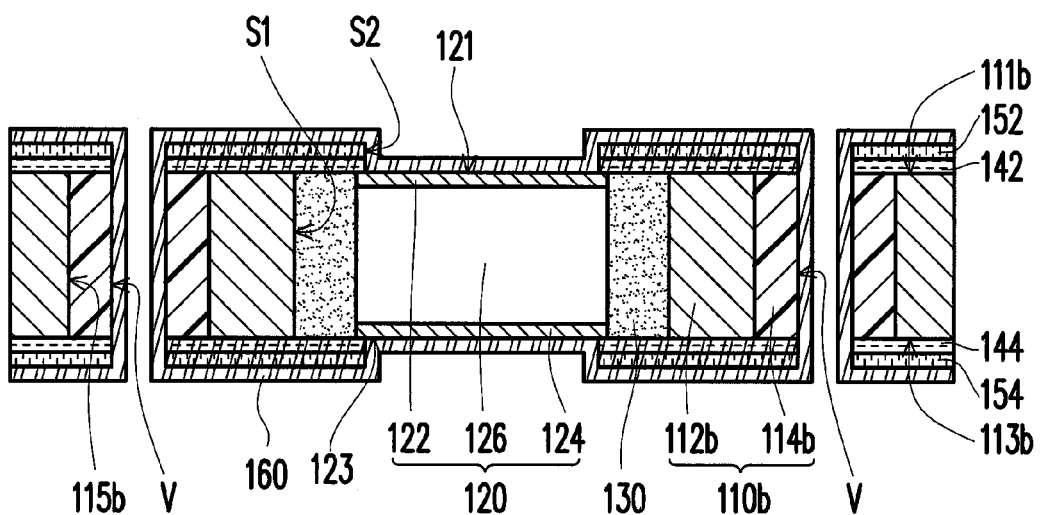

With reference to FIG. 3F, at least one through via V that passes through the first metal layer 152, the first insulation layer 142, the substrate 110b, the second insulation layer 144, and the second metal layer 154 is formed. In FIG. 3F, two through vias V are schematically shown. A method of forming the through vias V includes mechanical drilling or laser drilling.

As shown in FIG. 3F, a third metal layer 160 is formed to cover the first metal layer 152, a portion of the first insulation layer 142 and the portion of the top surface 121 of the heat-conducting element 120 exposed by the second opening S2, the second metal layer 154, a portion of the second insulation layer 144 and the portion of the bottom surface 123 of the heat-conducting element 120 exposed by the third opening S3, and the inner wall of the through vias V. In this embodiment, the third metal layer 160 is formed by electroplating, for instance.

Figure 3G:
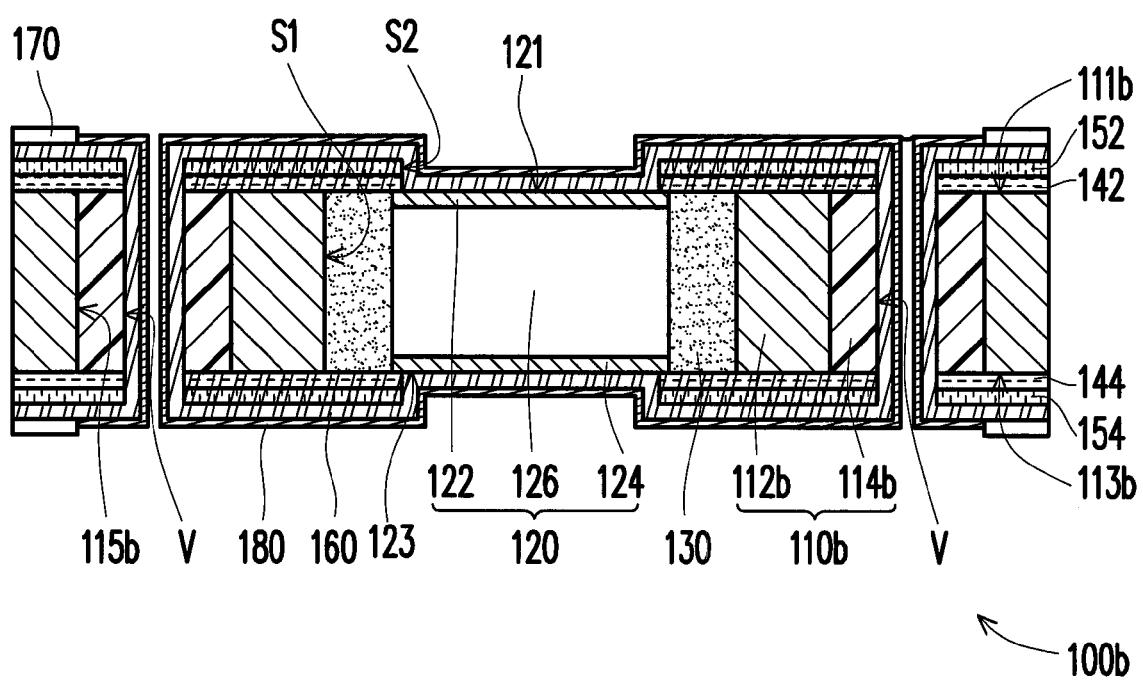

With reference to FIG. 3G, a solder mask 170 is formed on the third metal layer 160. A surface passivation layer 180 is formed. The surface passivation layer 180 covers both the third metal layer 160 exposed by the solder mask 170 and the third metal layer 160 located on the inner wall of the through vias V. In this embodiment, the surface passivation layer 180 is made of nickel gold, for instance, so as to reduce the oxidization rate of the first and second metal layers 152 and 154. So far, the fabrication of the package carrier 100b is substantially completed.

In terms of the structure of the package carrier 100b, as shown in FIG. 3F, the package carrier 100b of this embodiment includes the substrate 110b, the heat-conducting element 120, the insulation material 130, the first insulation layer 142, the second insulation layer 144, the first metal layer 152, the second metal layer 154, at least one through via V, the third metal layer 160, the solder mask 170, and the surface passivation layer 180. In FIG. 3F, two through vias V are schematically illustrated. The substrate 110b has an upper surface 111b and a lower surface 113b opposite to the upper surface 111b. Here, the substrate 110b includes a metal board 112b and the insulation blocks 114b. The metal board 112b has the first opening S1 and the through holes 115b, and the insulation blocks 114b are configured in the through holes 115b, respectively. The heat-conducting element 120 is configured in the first opening S1 of the substrate 110b and has the top surface 121 and the bottom surface 123 opposite to the top surface 121. The insulation material 130 fills the first opening S1 of the substrate 110b to fix the heat-conducting element 120 into the first opening S1 of the substrate 110b. The first insulation layer 142 is configured on the upper surface 111b of the substrate 110b and covers the upper surface 111b, a portion of the insulation material 130, and the top surface 121 of the heat-conducting 120. Here, the first insulation layer 142 has the second opening S2 that exposes a portion of the top surface 121 of the heat-conducting element 120. The second insulation layer 144 is configured on the lower surface 113b of the substrate 110b and covers the lower surface 113b, a portion of the insulation material 130, and a portion of the lower surface 123 of the heat-conducting 120. Here, the second insulation layer 144 has the third opening S3 that exposes a portion of the bottom surface 123 of the heat-conducting element 120. The first metal layer 152 is configured on the first insulation layer 142. The second metal layer 154 is configured on the second insulation layer 144. The through vias V pass through the first metal layer 152, the first insulation layer 142, the insulation blocks 114b of the substrate 110b, the second insulation layer 144, and the second metal layer 154. The third metal layer 160 covers the first metal layer 152, the first insulation layer 142 and the portion of the top surface 121 of the heat-conducting element 120 exposed by the second opening S2, the second metal layer 154, the second insulation layer 144 and the portion of the bottom surface 123 of the heat-conducting element 120 exposed by the third opening S3, and the inner wall of the through vias V. The solder mask 170 is configured on the third metal layer 160. The surface passivation layer 180 covers both the third metal layer 160 that is exposed by the solder mask 170 and the third metal layer 160 that is located on the inner wall of the through vias V.

Figure 4:
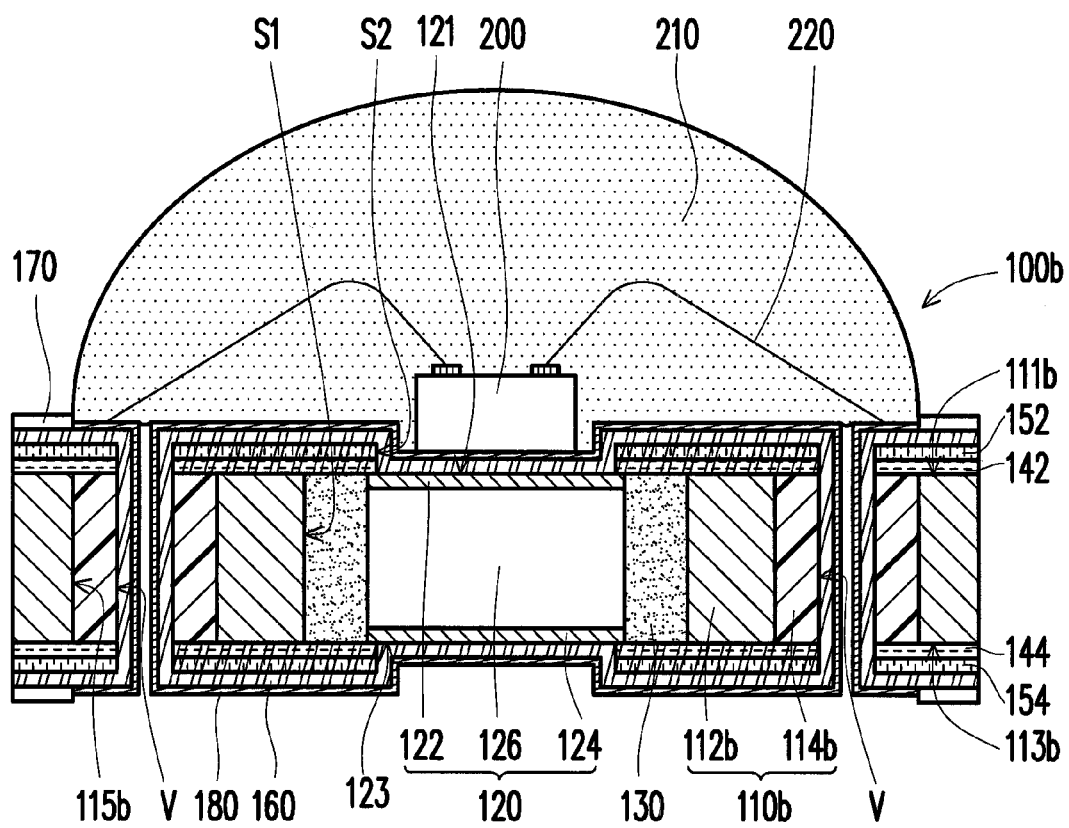
FIG. 4 is a schematic cross-sectional view illustrating that the package carrier depicted in FIG. 3G carries a heat-generating element.

FIG. 4 is a schematic cross-sectional view illustrating that the package carrier depicted in FIG. 3G carries a heat-generating element. With reference to FIG. 4, in this embodiment, the package carrier 100b is suitable for holding a heat-generating element 200. The heat-generating element 200 is configured on the surface passivation layer 180 correspondingly located above a portion of the top surface 121 of the heat-conducting element 120 exposed by the second opening S2. The heat-generating element 200 is an electronic chip or a photoelectric device, for instance, which should not be construed as a limitation to the invention. For instance, the electronic chip can be an integrated circuit chip, e.g., a chip module or an individual chip that includes a graphic chip, a memory chip, and a semiconductor chip. The photoelectric element is an LED, a laser diode, or a gas discharge light source, for instance. In this embodiment, the heat-generating element 200 is an LED, for instance.

Specifically, the heat-generating element 200, e.g., a semiconductor chip, can be electrically connected to the surface passivation layer 160 by wire bonding through a plurality of bonding wires 220. Alternatively, the heat-generating element 200, the bonding wires 220, and a portion of the package carrier 100b can be encapsulated by a molding compound 210, so as to secure the electrical connection among the heat-generating element 200, the bonding wires 220, and the package carrier 100b. Since the coefficient of thermal expansion of the heat-conducting element 120 of this embodiment is smaller than the coefficient of thermal expansion of the substrate 110b, the difference in the coefficient of thermal expansion of the heat-generating element 200, the coefficient of thermal expansion of the heat-conducting element 120, and the coefficient of thermal expansion of the substrate 110b can gradually decrease. As such, the difference in the coefficient of thermal expansion is not significant enough to increase the stress among the heat-generating element 200, the heat-conducting element 120, and the substrate 110b. Thereby, the heat-generating element 200 is not peeled off or damaged, and the reliability of the package carrier 100b can be improved.

In addition, the coefficient of thermal conductivity of the heat-conducting element 120 is greater than the coefficient of thermal conductivity of the substrate 110b, and the heat-conducting element 120 is embedded in the substrate 110b. The first metal layer 152 and the second metal layer 154 are respectively configured above the top surface 121 and the bottom surface 123 of the heat-conducting element 120. Therefore, when the het-generating element 200 is configured on the package carrier 100b, the heat generated by the heat-generating element 200 can be rapidly transmitted to the external surroundings through the heat-conducting element 120 and the metal layers (including the first, second, and third metal layers 152, 154, and 160) located on the substrate 110b. As such, the package carrier 100b described in the embodiments of the invention can effectively dissipate the heat generated by the heat-generating element 200, and the efficiency and the life span of the heat-generating element 200 can both be improved.

Note that the way to bond the heat-generating element 200 and the package carrier 100b and the type of the heat-generating element 200 are not limited in the invention. Although the heat-generating element 200 described in this embodiment is electrically connected to the surface passivation layer 180 of the package carrier 100b, the heat-generating element 200 in another embodiment can also be electrically connected to the surface passivation layer 180 located above the heat-conducting element 120 by flip-chip bonding through a plurality of bumps (not shown). In another embodiment of the invention, the heat-generating element 200 can be a chip package (not shown) and is installed to the package carrier 100b by conducting a surface mount technology (SMT). The way to bond the heat-generating element 200 and the package carrier 100b and the type of the heat-generating element 200 are exemplary and should not be construed as limitations to the invention.

In light of the foregoing, the package carrier described in the above embodiments has the heat-conducting element that is embedded in the substrate. Hence, when a heat-generating element is configured on the package carrier, the heat generated by the heat-generating element can be rapidly transmitted to the external surroundings through the heat-conducting element and the metal layers located on the substrate. As such, the package carrier described in the embodiments of the invention can effectively dissipate the heat generated by the heat-generating element, and the efficiency and the life span of the heat-generating element can both be improved. In addition, the package carrier described in the above embodiments of the invention has the conductive layers and the insulation layers that are laminated onto the substrate, which not only can enhance the structural strength of the entire package carrier but also can improve heat-conducting effects of the package carrier. Moreover, since the coefficient of thermal expansion of the heat-conducting element of this embodiment is smaller than the coefficient of thermal expansion of the substrate, the difference in the coefficient of thermal expansion of the heat-generating element, the coefficient of thermal expansion of the heat-conducting element, and the coefficient of thermal expansion of the substrate can gradually decrease. As such, the difference in the coefficient of thermal expansion is not significant enough to increase the stress among the heat-generating element, the heat-conducting element, and the substrate. Thereby, the heat-generating element is not peeled off or damaged, and the reliability of the package carrier can be improved.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A package carrier suitable for carrying a heat-generating element, the package carrier comprising:
    a substrate having an upper surface, a lower surface opposite to the upper surface, and a first opening communicating the upper surface and the lower surface;
    a heat-conducting element configured in the first opening of the substrate and having a top surface and a bottom surface opposite to the top surface;
    an insulation material filling the first opening of the substrate to fix the heat-conducting element into the first opening of the substrate;
    a first insulation layer configured on the upper surface of the substrate and covering the upper surface and a portion of the insulation material, the first insulation layer having a second opening, the second opening exposing a portion of the top surface of the heat-conducting element;
    a second insulation layer configured on the lower surface of the substrate and covering the lower surface and a portion of the insulation material, the second insulation layer having a third opening, the third opening exposing a portion of the bottom surface of the heat-conducting element;
    a first metal layer configured on the first insulation layer;
    a second metal layer configured on the second insulation layer;
    at least one through via passing through the first metal layer, the first insulation layer, the substrate, the second insulation layer, and the second metal layer;
    a third metal layer covering the first metal layer, the first insulation layer and the portion of the top surface of the heat-conducting element exposed by the second opening, the second metal layer, the second insulation layer and the portion of the bottom surface of the heat-conducting element exposed by the third opening, and an inner wall of the at least one through via;
    a solder mask configured on the third metal layer; and
    a surface passivation layer covering both the third metal layer exposed by the solder mask and the third metal layer located on the inner wall of the at least one through via, the heat-generating element being configured on the surface passivation layer correspondingly located above the portion of the top surface of the heat-conducting element exposed by the second opening.

2. The package carrier as claimed in claim 1, wherein the substrate comprises a first copper foil layer, a second copper foil layer, and an insulation layer configured between the first copper foil layer and the second copper foil layer.

3. The package carrier as claimed in claim 1, wherein the substrate comprises a metal board and at least one insulation block, the metal board has the first opening and at least one through hole, and the at least one insulation block is configured in the at least one through hole.

4. The package carrier as claimed in claim 1, wherein the heat-conducting element comprises a first conductive layer, a second conductive layer, and an insulation material layer located between the first conductive layer and the second conductive layer.

5. The package carrier as claimed in claim 1, wherein a material of the heat-conducting element comprises ceramics, silicon, silicon carbide, diamond, or metal.

6. The package carrier as claimed in claim 1, wherein a coefficient of thermal expansion of the heat-conducting element is smaller than a coefficient of thermal expansion of the substrate, and a coefficient of thermal conductivity of the heat-conducting element is greater than a coefficient of thermal conductivity of the substrate.

* * * * *